United States Patent
Chen et al.

(10) Patent No.: US 9,437,284 B1
(45) Date of Patent: Sep. 6, 2016

(54) MEMORY DEVICES AND CONTROL METHODS THEREOF

(71) Applicant: VANGUARD INTERNATIONAL SEMICONDUCTOR CORPORATION, Hsinchu (TW)

(72) Inventors: Jui-Lung Chen, Hsinchu (TW); Wei-Ting Chen, Kaohsiung (TW); Yu-Hsi Ke, Kaohsiung (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 14/957,311

(22) Filed: Dec. 2, 2015

(51) Int. Cl.
*G11C 11/00* (2006.01)
*G11C 11/419* (2006.01)
*G11C 11/418* (2006.01)
*G11C 11/413* (2006.01)
*G11C 11/412* (2006.01)

(52) U.S. Cl.
CPC ............ *G11C 11/419* (2013.01); *G11C 11/412* (2013.01); *G11C 11/413* (2013.01); *G11C 11/418* (2013.01)

(58) Field of Classification Search
CPC . G11C 11/419; G11C 11/418; G11C 11/412; G11C 11/413
USPC ........................................ 365/154, 155, 156
See application file for complete search history.

(56) References Cited

U.S. PATENT DOCUMENTS

| | | | | |
|---|---|---|---|---|
| 6,862,213 | B2* | 3/2005 | Hamaguchi | G11C 11/5685 365/148 |
| 6,990,031 | B2* | 1/2006 | Hashimoto | G11C 11/4074 365/189.09 |
| 7,145,830 | B2* | 12/2006 | Takahashi | G11C 11/406 365/227 |
| 7,301,843 | B2* | 11/2007 | Tsukude | G11C 11/406 365/222 |
| 7,321,515 | B2 | 1/2008 | Shimbayashi et al. | |
| 7,821,861 | B2* | 10/2010 | Lin | G11C 11/40603 365/189.12 |
| 8,995,216 | B2* | 3/2015 | Furutani | G11C 8/06 365/222 |

FOREIGN PATENT DOCUMENTS

| | | |
|---|---|---|
| TW | 540050 B | 7/2003 |
| TW | 200732914 A | 9/2007 |
| TW | 200931436 A | 7/2009 |

\* cited by examiner

*Primary Examiner* — Pho M Luu
(74) *Attorney, Agent, or Firm* — Birch, Stewart, Kolasch & Birch, LLP

(57) ABSTRACT

A memory device is provided. The memory device includes a memory device, a plurality of word lines and bit lines, first and second decoders, and a control circuit. The memory array includes memory cells on rows and columns. Each word line is coupled to the memory cells in one row. Each bit line is coupled to the memory cells in one column. The first decoder selects one word line according to an address signal and a first control signal. The control circuit respectively generates the first control signal and the second control signal according to a first clock signal and a second clock signal. In the period during which the first decoder selects the one word line, the second decoder selects at least two bit lines according to the address signal and a second control signal. The memory device performs a read/write operation on the selected bit lines.

14 Claims, 4 Drawing Sheets

US 9,437,284 B1

MEMORY DEVICES AND CONTROL METHODS THEREOF

BACKGROUND OF THE INVENTION

1. Field of the Invention

The invention relates to a memory device and, more particularly, to a static random access memory (SRAM) which can perform a read/write operation on memory cells on one word line several times continuously, thereby decreasing the number of times that the pre-charging operation is performed and reducing power consumption.

2. Description of the Related Art

Generally, the control circuit of a static random access memory (SRAM) device controls a decoder according a single clock signal for selecting corresponding memory cells. Whenever the positive edge of the clock signal occurs, the control circuit locks the address one time for selecting a corresponding word line and bit line (that is, for selecting the corresponding memory cell). At this time, the memory device performs a pre-charging operation on the corresponding word line first, and then performs a read/word operation of one bit for the corresponding memory cell. Thus, whenever the positive edge of the clock signal occurs, the memory device performs the pre-charging operation one time. However, a surge current is induced on the word lines and the bit lines by the pre-charging operation. Referring to FIG. 1, at whatever time the positive edge of the clock signal CLK occurs, the supply current $I_{VDD}$ is pulled down suddenly by the induced surge current, which increases power consumption during the operation of the memory device.

BRIEF SUMMARY OF THE INVENTION

An exemplary embodiment of a memory device is provided. The memory device comprises a memory device, a plurality of word lines, a plurality of bit lines, a first decoder, a second decoder, and a control circuit. The memory array comprises a plurality of memory cells disposed on a plurality of rows and a plurality of columns. Each word line is coupled to the memory cells disposed on one of the plurality of rows. Each bit line is coupled to the memory cells disposed on one of the plurality of columns. The first decoder receives an address signal and a first control signal and selects one of the plurality of word lines according to the address signal and the first control signal. The second decoder receives the address signal and a second control signal. The control circuit receives a first clock signal and a second clock signal. The control circuit generates the first control signal according to the first clock signal, and further generates the second signal according to the second clock signal. In a period during which the first decoder selects the one of the plurality of word line according to the address signal and the first control signal, the second decoder selects at least two of the plurality of bit lines according to the address signal and the second control signal, and the memory device performs a read/write operation on the selected at least two of the plurality of bit lines.

An exemplary embodiment of a control method for a memory device is provided. The memory device comprises a memory array, a plurality of word lines coupled to the memory device, and a plurality of bit lines coupled to the memory device. The control method comprises the steps of receiving a first clock signal and a second clock signal; generating a first control signal according to the first clock signal; generating a second signal according to the second clock signal; selecting one of the plurality of word lines according to an address signal and an enable state of the first control signal; in a period during which the one of the plurality of word lines according to the address signal and the first control signal is selected, selecting at least two of the plurality of bit lines according to the address signal and an enable signal of the second control signal; and performing a read/write operation on the selected at least two of the plurality of bit lines.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
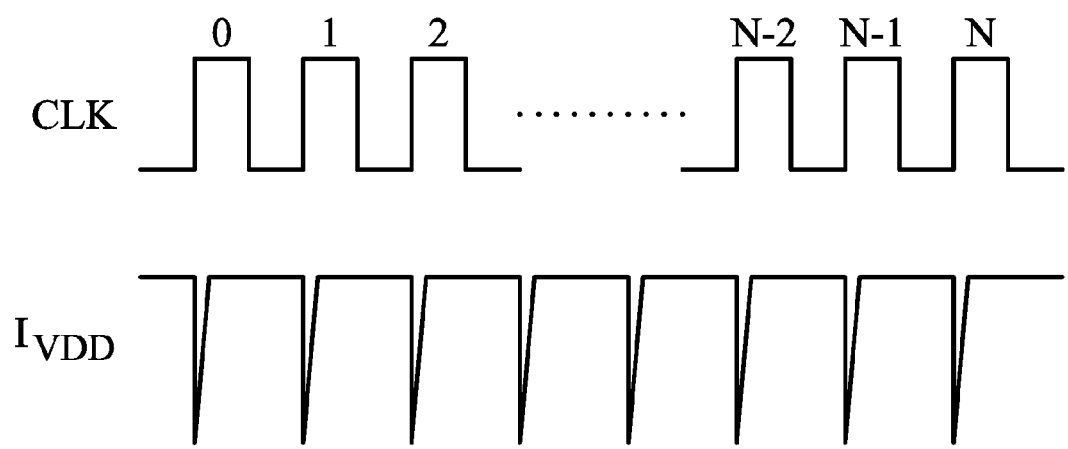
FIG. 1 is a schematic diagram illustrating a clock signal and a supply current of a conventional memory device.
Figure 2:
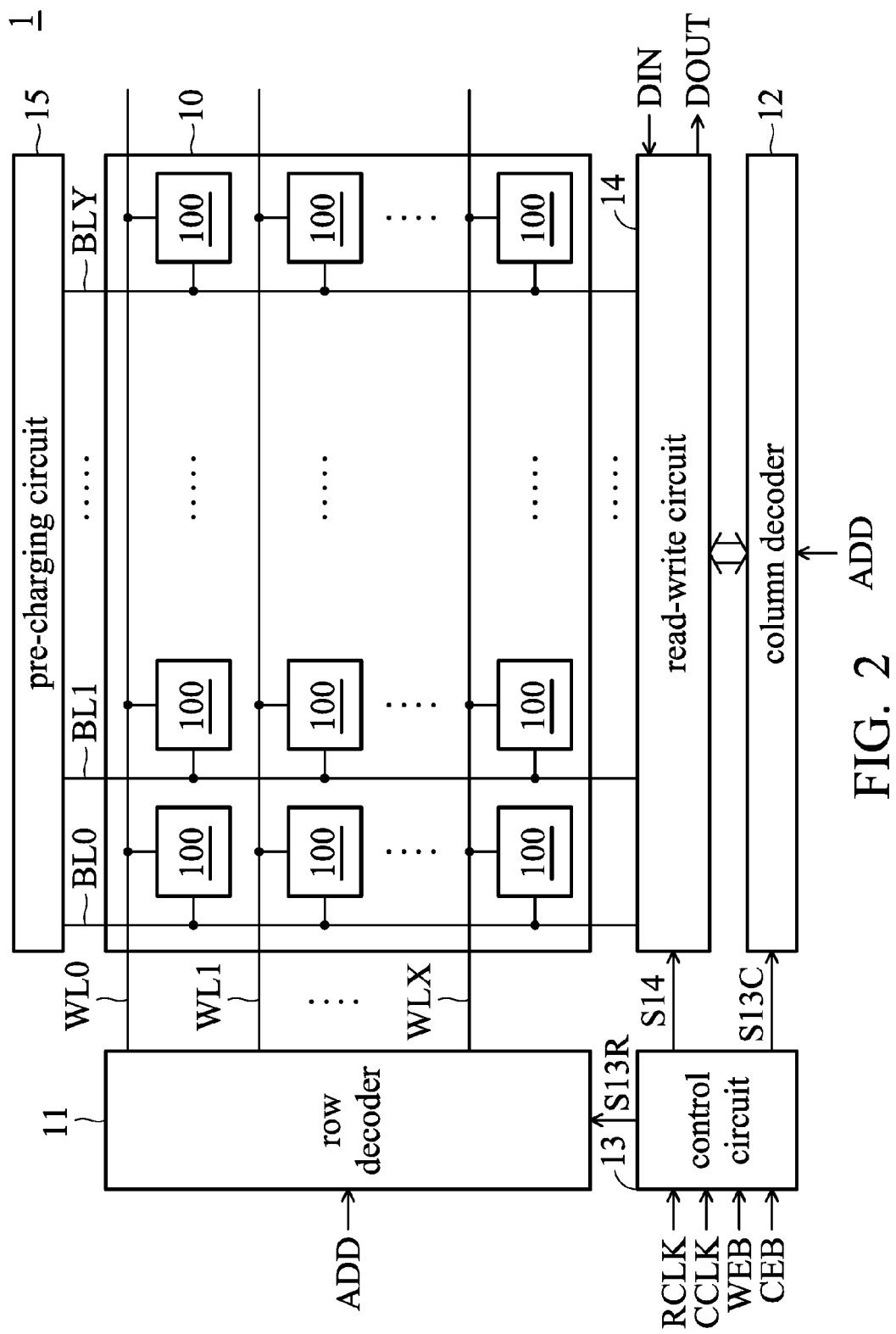
FIG. 2 shows an exemplary embodiment of a memory device.

FIG. 2 shows an exemplary embodiment of a memory device. Referring to FIG. 2, the memory device 1 comprises a memory array 10, a row decoder 11, a column decoder 12, a control circuit 13, a read-write circuit 14, and a pre-charging circuit 15. In an embodiment, the memory device 1 is a static random access memory (SRAM). The memory array 10 comprises a plurality of memory cells 100 which are disposed on a plurality of rows and a plurality of columns. The row decoder 11 is connected to the memory pixel 10 through word lines WL1-WLX. Each word line is connected to the memory cells 100 which are disposed on the row. The column 12 decoder is connected to the memory pixel 10 through bit lines BL1-BLY. Each bit line is connected to the memory cells 100 which are disposed on the column. According to the configuration of the word lines WL1-WLX, bit lines BL1-BLY, and memory cells 100, each memory cell 100 corresponds to one set of bit line and word line.

Figure 3:
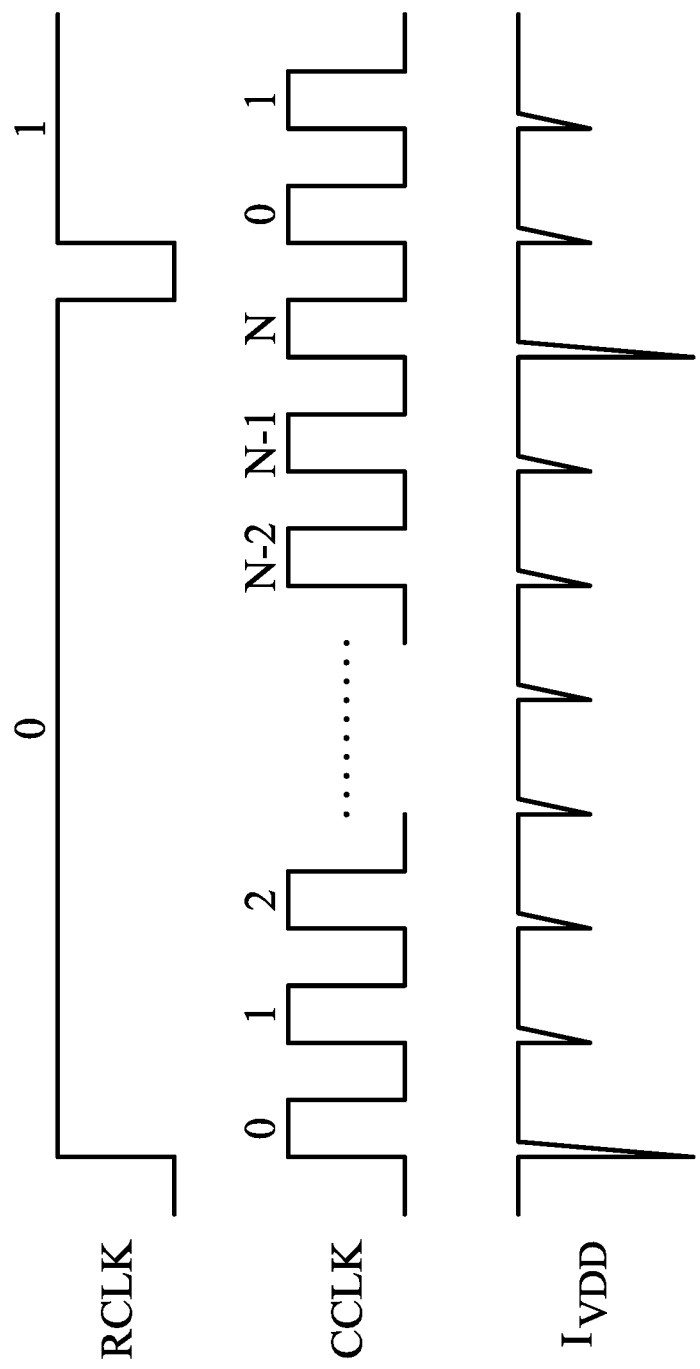
FIG. 3 is a schematic diagram illustrating clock signals and a supply current according to an exemplary embodiment of the invention.

The control circuit 13 receives different clock signals RCLK and CCLK. The control circuit 13 generates a control signal S13R to the row decoder 11 according to the clock signal CLK and generates a control signal S13C to the column decoder 12 according to the clock signal CCLK. Referring to FIG. 3, the frequency of the clock signal RCLK is different from the frequency of the clock signal CCLK. In detail, the clock signal RCLK comprises a plurality of pulse PLSR, while the clock signal CCLK comprises a plurality of pulse PLSC. In the duration of each pulse PLSR of the clock signal RCLK, several pulses PLSC of the clock signal CCLK occur. For example, in the duration of each pulse PLSR of the clock signal RCLK, (N+1) pulses PLSC of the clock signal CCLK occur, wherein N 1. The control circuit 13 further receives enable signals WEB and CEB, respectively used for writing enabling and chip enabling of the memory device 1. The control circuit 13 generates a control signal S14 to the read-write circuit 14 to control the read-write circuit 14 to perform a read or write operation. The operation of the memory device 1 will be described by referring to FIGS. 2 and 3.

Whenever the positive-edge triggering event of the clock signal RCLK occurs, the control circuit 13 generates the control signal S13R with an enable state to enable the decoder 11, so that the decoder 11 locks one address according to the received address signal ADD and selects one word line, such as the word line WL1, according to the locked address. Whenever the positive-edge triggering event of the clock signal CCLK occurs, the control circuit 13 generates the control signal S13C with an enable state to enable the decoder 12, so that the decoder 12 locks one address according to the received address signal ADD and selects one bit line according to the locked address. Referring to FIG. 3, in the period between two successive time points, each when a positive-edge triggering event of the clock signal RCLK occurs (that is in the period between a first time point at which a positive-edge triggering event of the clock signal RCLK occurs and a second time point at which the positive-edge triggering event of the clock signal RCLK occurs again after the first time point), the positive-edge triggering event of the clock signal CCLK occurs several times. Thus, in the period during which one word line is selected, several bit lines (at least two bit lines) are selected, and the read-write circuit 14 performs a read/write operation on each of the selected bit lines according to the control signal S14 from the control circuit 13 for reading data DOUT from the corresponding memory cells or writing data DIN to the corresponding memory cells. In an embodiment, the data DOUR and the data DIN is serial data. When the read-write circuit 14 performs a read/write operation, the data DOUT is read from or written to the memory cells in a frame-page mode, a packet mode, or a sequence mode. In this case, the memory device 1 is implemented as a buffer device.

As described above, the control circuit 13 controls the decoders 11 and 13 according to different respective clock signals, so that when a read/write operation is performed on at least two memory cells in the same row, the decoder 11 does not need to lock the address of the same word line two times. In detail, when one word line is selected, a read/write operation can be performed on at least two memory cells in the row associated with the word line until the read/write operation is completed. Then, another word line may be selected for the following read/write operation. In other words, after the read/write operation for the memory cells in one row is completed, the read/write operation for the memory cells in the next row can be performed. Thus, for the read/write operation on the memory cells in one row, the decoder 11 just locks the address one time.

Moreover, due to the selection of the word and bit lines and the data reading/writing manner described above, in the period during which the decoder 11 locks one address to select the corresponding word line, the pre-charging circuit 15 just performs a pre-charging operation on the bit lines BL1-BLY one time before a read/write operation is performed on the corresponding bit lines. Referring to FIG. 3, in the period during which the decoder 11 selects one word line, the pre-charging operation is performed only one time, so that the accompanying supply current $I_{VDD}$ is pulled down suddenly by the induced surge current only one time. Accordingly, the power consumed by the operation of the memory device 1 can be decreased.

In the above embodiment, in the period during which one word line is selected (that is, in the duration of one pulse PLSR of the clock signal RCLK), the read-write circuit 14 can perform a read operation on all of the selected bit lines, perform a write operation on all of the selected bit lines, or perform a read operation on one portion of the selected bit lines and a write operation on the other portion of the selected bit lines.

Figure 4:
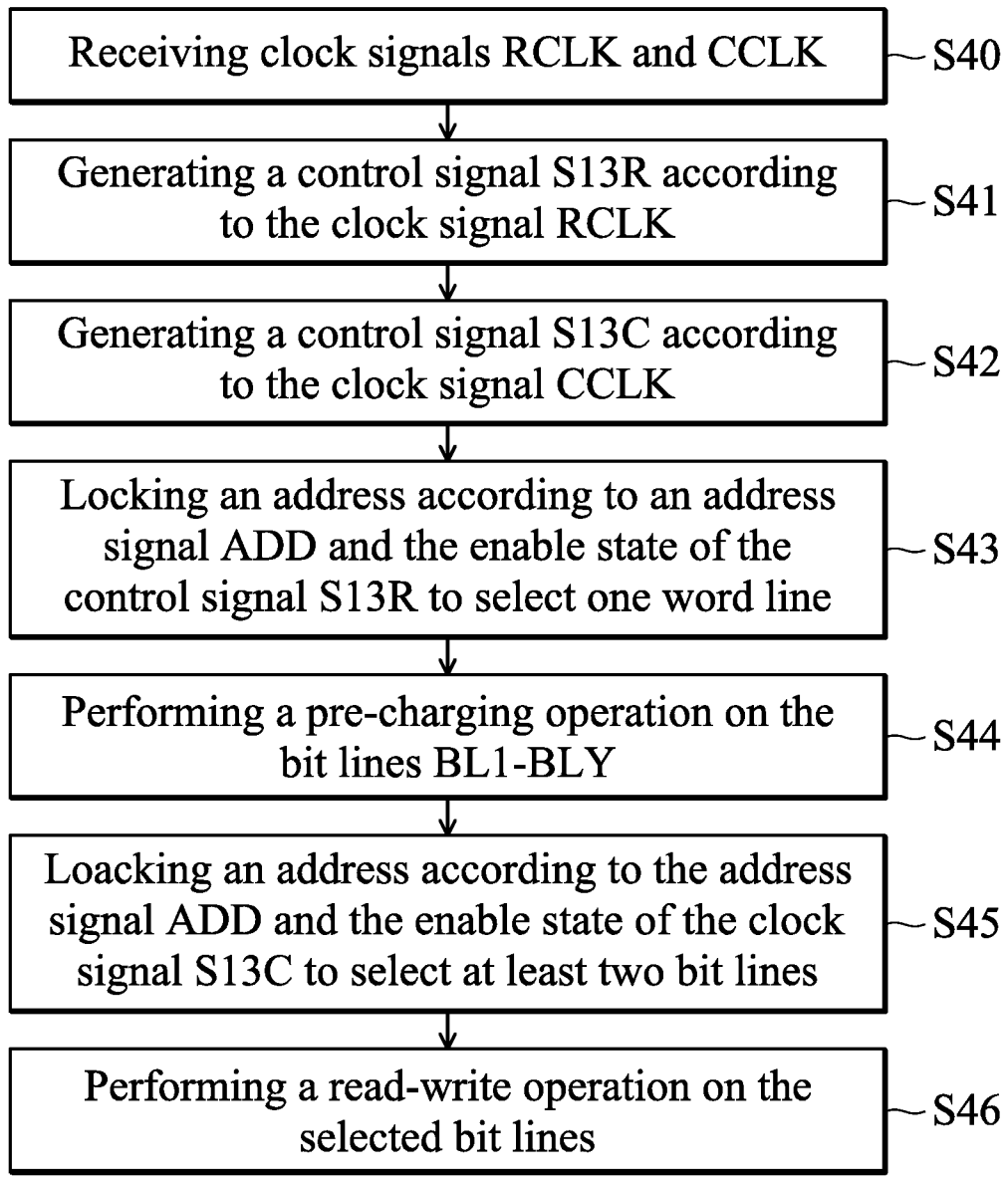
FIG. 4 shows an exemplary embodiment of a control method for a memory device.

FIG. 4 shows an exemplary embodiment of a control method for a memory device. The control method will be described by referring to FIGS. 2-4. First, two different clock signals RCLK and CCLK are received (step S40). A control signal S13R is generated according to the clock signal RCLK (step S41). In an embodiment, when a positive-edge triggering event of the clock signal RCLK occurs, the control signal S13R is enabled. A control signal S13C is generated according to the clock signal CCLK (step S42). In an embodiment, when a positive-edge triggering event of the clock signal CCLK occurs, the control signal S13C is enabled. An address is locked according to an address signal ADD and the enable state of the control signal S13R to select one word line (step S43). In the period during which the word line is selected, a pre-charging operation is performed on the bit lines BL1-BLY (step S44). In the period during which the word line is selected, after the pre-charging operation is completed, an address is locked according to the address signal ADD and the enable state of the clock signal S13C to select at least two bit lines (step S45). Then, a read-write operation is performed on the selected bit lines (step S46). When the read/write operation is completed, the control method proceeds to the step S43 to select another word line.

As described above, the clock signal RCLK for selecting word lines is different from the clock signal CCLK for selecting the bit lines, so that when a read/write operation is performed on at least two memory cells in the same row, the address locking for the same word line is not performed two times. Moreover, in the period during which one word line is selected, a pre-charging operation is performed only one time even though a read/write operation is performed on at least two bit lines, so that the accompanying supply current $I_{VDD}$ is pulled down suddenly by the induced surge current $I_{VDD}$ only one time. Accordingly, the power consumption of the memory device 1 can be decreased.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory device comprising:
   a memory array comprising a plurality of memory cells disposed on a plurality of rows and a plurality of columns;
   a plurality of word lines, each coupled to the memory cells disposed on one of the plurality of rows;
   a plurality of bit lines, each coupled to the memory cells disposed on one of the plurality of columns;

a first decoder receiving an address signal and a first control signal and selecting one of the plurality of word lines according to the address signal and the first control signal;

a second decoder receiving the address signal and a second control signal; and a control circuit receiving a first clock signal and a second clock signal, generating the first control signal according to the first clock signal, and generating the second signal according to the second clock signal, wherein in a period during which the first decoder selects the one of the plurality of word lines according to the address signal and the first control signal, the second decoder selects at least two of the plurality of bit lines according to the address signal and the second control signal, and the memory device performs a read/write operation on the selected at least two of the plurality of bit lines.

2. The memory device as claimed in claim 1, wherein the first clock signal comprises a plurality of first pulses, the second clock signal comprises a plurality of second pulses, and in a during of each of the plurality of first pulses, at least two of the plurality of second pulses occur.

3. The memory device as claimed in claim 1,
wherein whenever a positive-edge trigger event of the first clock signal occurs, decoder to select one of the plurality of word lines according to the address signal,
wherein whenever a positive-edge trigger event of the second clock signal occurs, the control circuit generates the second control signal to enable the second decoder to select one of the plurality of bit lines according to the address signal, and
wherein in a period between a first time point at which the positive-edge triggering event of the first clock signal occurs and a second time point at which the positive-edge triggering event of the first clock signal occurs again after the time point, the positive-edge triggering event of the second clock signal occurs several times.

4. The memory device as claimed in claim 1, wherein in the period during which the first decoder selects the one of the plurality of word lines according to the address signal and the first control signal, the memory device performs a pre-charging operation on the plurality of bit lines only one time.

5. The memory device as claimed in claim 1, wherein in the period during which the first decoder selects the one of the plurality of word lines according to the address signal and the first control signal, the memory device performs a read/write operation on at least two of the plurality of bit lines to read or write serial data.

6. The memory device as claimed in claim 5, wherein the memory device reads or writes the serial data in a frame-page mode, a packet mode, or a sequence mode.

7. The memory device as claimed in claim 1, wherein the memory device is a static random access memory (SRAM).

8. The memory device as claimed in claim 1, wherein the memory device is a buffer device.

9. A control method for a memory device which comprises a memory array, a plurality of word lines coupled to the memory device, and a plurality of bit lines coupled to the memory device, the control method comprising:
receiving a first clock signal and a second clock signal;
generating a first control signal according to the first clock signal;
generating a second signal according to the second clock signal;
selecting one of the plurality of word lines according to an address signal and an enable state of the first control signal;
in a period during which the one of the plurality of word lines according to the address signal and the first control signal is selected, selecting at least two of the plurality of bit lines according to the address signal and an enable signal of the second control signal; and
performing a read/write operation on the selected at least two of the plurality of bit lines.

10. The control method as claimed in claim 9, wherein the first clock signal comprises a plurality of first pulses, the second clock signal comprises a plurality of second pulses, and in a during of each of the plurality of first pulses, at least two of the plurality of second pulses occur.

11. The control method as claimed in claim 9,
wherein whenever a positive-edge trigger event of the first clock signal occurs, the first control signal is enabled,
wherein whenever a positive-edge trigger event of the second clock signal occurs, the second control signal is enabled, and
wherein in a period between a first time point at which the positive-edge triggering event of the first clock signal occurs and a second time point at which the positive-edge triggering event of the first clock signal occurs again after the time point, the positive-edge triggering event of the second clock signal occurs several times.

12. The control method as claimed in claim 9, further comprising:
in the period during which the one of the plurality of word lines according to the address signal and the first control signal, performing a pre-charging operation on the plurality of bit lines only one time.

13. The control method as claimed in claim 9, wherein the step of performing the read/write operation comprises:
reading or writing serial data.

14. The control method as claimed in claim 13, wherein the serial data is read or written in a frame-page mode, a packet mode, or a sequence mode.

* * * * *